(12) United States Patent
Gschwendtberger et al.

(10) Patent No.: US 9,671,428 B2
(45) Date of Patent: Jun. 6, 2017

(54) CONTACT SPRING FOR A TESTING BASE FOR THE HIGH CURRENT TESTING OF AN ELECTRONIC COMPONENT

(71) Applicant: Multitest elektronische Systeme GmbH, Rosenheim (DE)

(72) Inventors: Gerhard Gschwendtberger, Brannenburg (DE); Volker Leikermoser, Aschau (DE); Manuel Petermann, Rosenheim (DE); Marcus Frey, Bernau (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 299 days.

(21) Appl. No.: 14/059,739

(22) Filed: Oct. 22, 2013

(65) Prior Publication Data
US 2014/0111237 A1   Apr. 24, 2014

(30) Foreign Application Priority Data
Oct. 24, 2012   (EP) .................................... 12189810

(51) Int. Cl.
*G01R 1/067*   (2006.01)
*G01R 1/04*   (2006.01)

(52) U.S. Cl.
CPC ....... *G01R 1/06733* (2013.01); *G01R 1/0466* (2013.01); *G01R 1/06738* (2013.01)

(58) Field of Classification Search
CPC .............. G01R 1/06733; G01R 1/0466; G01R 1/06738; G01R 1/06722; G01R 1/067;
(Continued)

(56) References Cited

U.S. PATENT DOCUMENTS 3,812,311 A * 5/1974 Kvaternik .............. G01R 1/067
324/755.05
4,998,886 A * 3/1991 Werner .............. H01R 13/2435
439/631
(Continued)

FOREIGN PATENT DOCUMENTS

DE   195 33 272 A1   3/1996
JP   H06275350   9/1994
(Continued)

OTHER PUBLICATIONS

IPOS (Intellectual Property Office of Singapore) Search Report for parallel Application No. 2013079108; date of mailing Dec. 9, 2014; 8 pages.
(Continued)

*Primary Examiner* — Melissa Koval
*Assistant Examiner* — Felicia Farrow
(74) *Attorney, Agent, or Firm* — Lewis Roca Rothgerber Christie LLP

(57) ABSTRACT

A contact spring for a testing base for high current testing of an electronic component, which is produced from a spring metal sheet of a predetermined thickness and possesses two identical opposing lateral faces, and which has a spring arm and a testing arm with a testing tip, where the testing arm forms an angle with the spring arm, which enables the testing tip to be positioned on a contact surface of the electronic component running approximately parallel to the spring arm, by relative movement between the testing base and the electronic component.

4 Claims, 2 Drawing Sheets

(58) Field of Classification Search
CPC .... G01R 1/06716; G01R 1/0433; G01R 1/0408;
G01R 1/07307; G01R 1/07342; G01R
1/06711; G01R 1/06772; G01R 1/07314;
G01R 1/06727; G01R 3/00; G01R
3/31905; H01R 13/2464; H01R 13/187;
H01R 4/4809; H01R 4/4881; H01R
43/16; B08B 7/00
USPC .......... 324/755.01–755.11; 439/816
See application file for complete search history.

(56) References Cited

U.S. PATENT DOCUMENTS

| | | | |
|---|---|---|---|
| 5,562,473 | A | 10/1996 | Ikeya et al. |
| 5,641,945 | A | 6/1997 | Abe et al. |
| 5,800,184 | A * | 9/1998 | Lopergolo ........... H05K 7/1069 |
| | | | 439/591 |
| 7,254,889 | B1 * | 8/2007 | Cherian ............... G01R 1/0466 |
| | | | 324/755.05 |
| 8,727,792 | B2 | 5/2014 | Ishibashi et al. |
| 2005/0212539 | A1 * | 9/2005 | Chen .................. G01R 1/06744 |
| | | | 324/755.07 |
| 2007/0072479 | A1 | 3/2007 | Osato et al. |
| 2010/0120269 | A1 | 5/2010 | Hsiao et al. |
| 2010/0311285 | A1 | 12/2010 | Gschwendtberger |
| 2012/0233853 | A1 | 9/2012 | Ishibashi et al. |
| 2013/0049782 | A1 * | 2/2013 | Vettori ............... G01R 1/06727 |
| | | | 324/754.1 |

FOREIGN PATENT DOCUMENTS

| | | |
|---|---|---|
| JP | 7-94252 | 4/1995 |
| WO | WO 2009/149949 A1 | 12/2009 |
| WO | WO 2011/067884 A1 | 6/2011 |

OTHER PUBLICATIONS

IPOS (Intellectual Property Office of Singapore) Written Opinion for parallel Application No. 2013079108; date of mailing Dec. 9, 2014; 13 pages.
European Search Report of Corresponding Priority Application EP 12189810.0, dated Feb. 22, 2013, 4 pages.
Japanese Office action issued in parallel Japanese Application No. 2013-216983; date of mailing Feb. 14, 2017; 4 pages, with English Translation (4 pages).

* cited by examiner

CONTACT SPRING FOR A TESTING BASE FOR THE HIGH CURRENT TESTING OF AN ELECTRONIC COMPONENT

CROSS-REFERENCE TO RELATED APPLICATION(S)

This application claims priority to and the benefit of European Patent Application No. 12 189 810.0, filed 24 Oct. 2012, the disclosure of which is incorporated herein in its entirety by reference.

FIELD OF THE INVENTION

Embodiments of the invention relate to a contact spring for a testing base for the current testing, in particular high current testing, of an electronic component.

ART BACKGROUND

Electronic components are usually subjected to certain tests in order to check their electrical functions. For this purpose a plurality of possible options have become known. For example the electronic components can be tested on the substrate before they are individualised. Or a carrier is provided on which a multiplicity of the electronic components are attached.

The carrier or substrate is then transferred to a so-called handler. The handler normally comprises a stationary testing head, with which a similarly stationary testing base is connected. The carrier or substrate is accurately positioned relative to the testing base. A testing base can be used, which makes contact with and tests all the electronic components at the same time, or only certain groups of components are tested at the same time, or each component is even tested individually. If not all the electronic components are tested at the same time the carrier or substrate must be repositioned after each step in the test.

In certain cases, however, electronic modules are also individually transferred to a handler and are processed further there individually. Here the individual components are inserted into a so-called nest and in the latter are positioned relative to the testing base.

Electronic components have become known that can switch and conduct high currents. Such components are required, for example, in power supplies for facilities with a high power demand, rapid switching intervals and the lowest possible losses.

For the high current testing of such an electronic component testing bases are often used that have two contact springs for some of the contact surfaces of the electronic component with which contact is to be made. Here one of the contact springs serves to subject the electronic component to the switching signal, and the other serves to supply the current to be switched.

Since both contact springs make contact with a single contact surface, they must be arranged relatively close to one another. On the other hand they require a high current carrying capacity. Here therefore, the small building space that is available is in conflict with the requirement for a diameter being as large as possible with a surface area being as large as possible for high current carrying capacity and good heat dissipation.

Contact springs of known art are produced from spring metal sheet and accordingly have two equal lateral faces, while their thickness is everywhere constant. The thickness of the spring metal sheet is dependent in particular on the separation distance and the size of the contact surfaces of the electronic component. In electronic components with very many, small contact surfaces located close together accordingly contact springs with a low thickness must be used, since otherwise the contact springs arranged side-by-side would affect one another or would even contact one another. As a result of the conflicting requirements of size and current carrying capacity conventional contact springs for the high current testing of electronic components with many contact surfaces located close together in particular usually have only a low service life.

The spring force of the contact springs is determined on the one hand by their material thickness and on the other hand by the minimum thickness of the spring arm. Since the spring force should always be approximately dimensioned to be the same, in the case of contact springs with a greater material thickness the said minimum thickness of the spring arm is chosen to be smaller than in the case of contact springs with a lesser material thickness.

SUMMARY OF THE INVENTION

The need that underlies embodiments of the invention is that of configuring a contact spring for a testing base for the current testing, in particular high current testing, of an electronic component, such that the service life of the contact spring can be lengthened despite the conflicting requirements. Furthermore a testing base is to be created for purposes of accommodating the inventive contact springs.

In accordance with embodiments of the invention this problem is solved by means of a contact spring for a testing base for the current testing, in particular high current testing, of an electronic component with the features of Claim 1 and a testing base with the features of Claim 4. Further details and advantages of embodiments of the invention ensue from the dependent claims.

In accordance with an example of embodiment of the invention a contact spring for a testing base for the current testing, in particular high current testing, of an electronic component is provided, which contact spring is produced from a spring metal sheet of a predetermined thickness and possesses two, in particular identical, opposing lateral faces, and comprises one spring arm and one testing arm with a testing tip, wherein the testing arm forms an angle with the spring arm, which enables the testing tip to be positioned on a contact surface of the electronic component running approximately parallel to the spring arm, by means of a relative movement between the testing base and the electronic component, wherein the geometry of the lateral faces fulfils the following conditions:

a dimension of the distance between a first point and a second point is at least 2.3 times a length the first point is located on the boundary line of the lateral face facing towards the electronic component, and comprises a distance from the testing tip of 3 times to 5 times, in particular 4 times, the length the first point forms the apex of an angle in a range between 120° and 150°, in particular of a 135° angle, the one leg of which extends in the direction of the relative movement between the testing base and the electronic component towards the electronic component, and the other leg of which cuts the boundary line of the lateral face facing away from the electronic component at the second point the length corresponds to the minimum thickness of the spring arm, as viewed in the direction of the relative movement between testing base and electronic component.

With such a contact spring geometry the service life of the contact spring can be significantly lengthened.

The contact can be deployed in the functional testing of electronic components (so-called back-end test). Here there are applications in which a relatively high current flows for a short time, so that the contact spring heats up. In particular for these applications, which relate to a high current causing a noticeable heating of the contact spring (of, for example, at least 10° C., in particular of, for example, 30° C.), examples of embodiment of the invention are particularly advantageous.

In accordance with one example of embodiment of the invention the lateral faces of a spring can be identical (i.e. upper and lower sides are congruent). Although such a spring can be produced particularly beneficially, a geometry with non-congruent lateral faces is also possible.

According to a preferred example of embodiment the geometry of the lateral faces of the contact spring fulfils the following conditions:

the dimension L of the distance between a point Po and a point Pu is at least 2.3 times the length L1 the point Po is located on the boundary line of the lateral face facing towards the electronic component, and comprises a distance from the testing tip of 4 times L1 the point Po forms the apex of a 135° angle, the one leg of which extends in the direction of the relative movement between the testing base and the electronic component towards the electronic component, and the other leg of which cuts the boundary line of the lateral face facing away from the electronic component at the point Pu the length L1 corresponds to the minimum thickness of the spring arm, as viewed in the direction of the relative movement between the testing base and the electronic component.

A classification of the contact springs into a testing arm and a spring arm in terms of shape is not immediately possible for all contact springs, since the testing arm and the spring arm often merge into one another without a clear junction. The subdivision should therefore be understood in functional terms: the testing arm carries the testing tip, which is positioned on the contact surface of the electronic component and is subjected to practically no elastic deformation; in contrast the spring arm is elastically deformed as each contact is made and moves back into its original shape as soon as the contact between testing tip and contact surface of the electronic component is released once again.

The contact spring is produced from a spring metal sheet and thus possesses the same thickness everywhere. Here the actual testing tip can form the only exception; this can be appropriately chamfered. In the side view of the spring arm and the testing arm a surface ensues with a punctiform tip and a bulge in the region connecting the spring arm and testing arm.

As already explained earlier above, the length L1 of the minimum thickness of the spring arm depends on the material thickness of the contact spring, since the spring force with which the testing tip is pressed onto the contact surface of the electronic component must always be of approximately the same magnitude. This means that the current carrying capacity of a contact spring with a shorter length L1 by virtue of its higher material thickness is normally higher than the current carrying capacity of a contact spring with a longer length L1, since the contact spring with the longer length L1 has a lower material thickness.

Since the length L1 of the minimum thickness of the spring arm is accordingly directly related to the current carrying capacity of the contact spring, this parameter has been used as a base parameter for the inventive teaching.

The dimension L for the distance between the point Po and the point Pu is a measure for the size of the lateral faces of the contact spring at a certain distance from the testing tip. The specified dimension L for the distance between the point Po and the point Pu defines an enhanced thermal capacity, amongst other properties. The enhancement in thermal capacity, which is necessary for an increased current carrying capacity, cannot be set directly at the tip of the contact spring, since here the space constraints do not allow this.

However, the enhanced thermal capacity must also not be placed at a too large distance from the testing tip, since there it could only provide a small effect. An excellent compromise between these requirements has proved to be a distance of the enhanced thermal capacity from the testing tip that corresponds to four times the length L1 of the minimum thickness of the spring arm.

The spring arm of the contact spring must be free so as to permit an elastic deformation of the spring arm if the testing tip is pressed onto the contact surfaces of the electronic component. In order that a stable and accurately positioned electrical connection of the contact spring with the testing base is nevertheless ensured, the spring arm of the contact spring comprises on its side facing away from the testing arm a mounting region, with which it is anchored in the testing base.

The contact springs are usually mounted in plastic. Since plastic possesses a lower thermal stability than metal, care must be taken to ensure that the temperatures of the contact springs in their mounting region do not exceed a critical temperature. The surface area of the contact springs is therefore preferably increased in their mounting region. To this end the lateral faces of the spring arm of the contact spring comprise a widening in the mounting region of the contact spring.

A testing base is provided for the high current testing of an electronic component, which testing base brings the contacts of the electronic component into an electrically conducting connection with contact springs. For this purpose the testing base has a multiplicity of the inventive contact springs.

The electronic component to be tested must be subjected to both switching signals and also to the currents that are to be switched, and the resulting currents must be measured. For this purpose a first contact spring and a second contact spring are provided for contacts of the electronic component, which contact springs are arranged such that their lateral faces are in each case located within a plane.

The thickening of the mounting region of the spring arm extends in each case in the direction that is opposed to the respectively other contact spring. In this manner the first and second contact springs, arranged in pairs, can be built very close together, and nevertheless achieve in their mounting region a surface area that enables good heat dissipation to the testing base. The temperature of the contact springs in the mounting region, despite the close arrangement in pairs, thus remains in a range that does not damage the mounting material.

As a result of the arrangement of the contact springs in pairs one above another and the location of the testing tips very close together the lateral faces of the upper first contact spring cannot be increased as much as the lateral faces of the lower second contact spring. It is particularly advantageous if the dimension L for the distance between the points Po and Pu in the case of the first upper contact spring is at least 2.35 times the length L1, and in the case of the second lower contact spring is at least 2.75 times the length L1.

Further individual features and advantages of embodiments of the invention ensue from the description of an example of embodiment, which is explained in more detail with the aid of the figures.

DETAILED DESCRIPTION OF EXEMPLARY EMBODIMENTS

Figure 1:
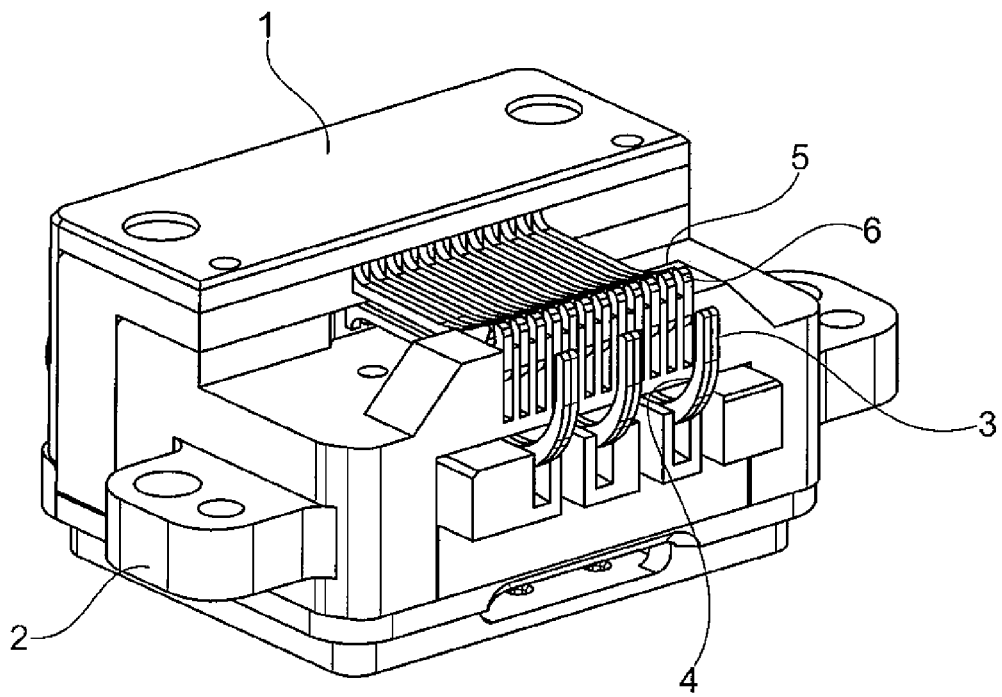
FIG. 1 shows an inventive testing base in a perspective view.

The testing base 1 shown in FIG. 1 is provided for the testing of an electronic component, which on one side possesses twelve contact surfaces on one of its lateral faces, and on the other side three contact surfaces. Contact is made with the three contact surfaces on the one side of the lateral face of the electronic component via the pairs of contact springs 3, 4, while the pairs of contact springs 5, 6 for the twelve contact surfaces are provided on the other side of the lateral face of the electronic component. Via the anchorages 2 the testing base is fixed in an accurate position on a testing head that is not shown here.

Since the contact springs 3, 4 and 5, 6 take the form of parts that are subject to wear, the testing base 1 is constructed such that it can be opened in a relatively simple manner and the contact springs 3, 4 and 5, 6 can be replaced without any difficulty.

The problems that have already been described above concerning current carrying capacity and thermal stability of the contact springs apply in particular to the pairs of contact springs 5, 6 that are concentrated into a very limited space. In contrast, the pairs of contact springs 3, 4 are spaced so far apart from one another that they can be appropriately shaped such that no special solution is necessary with the pairs of contact springs 3, 4.

Figure 2:
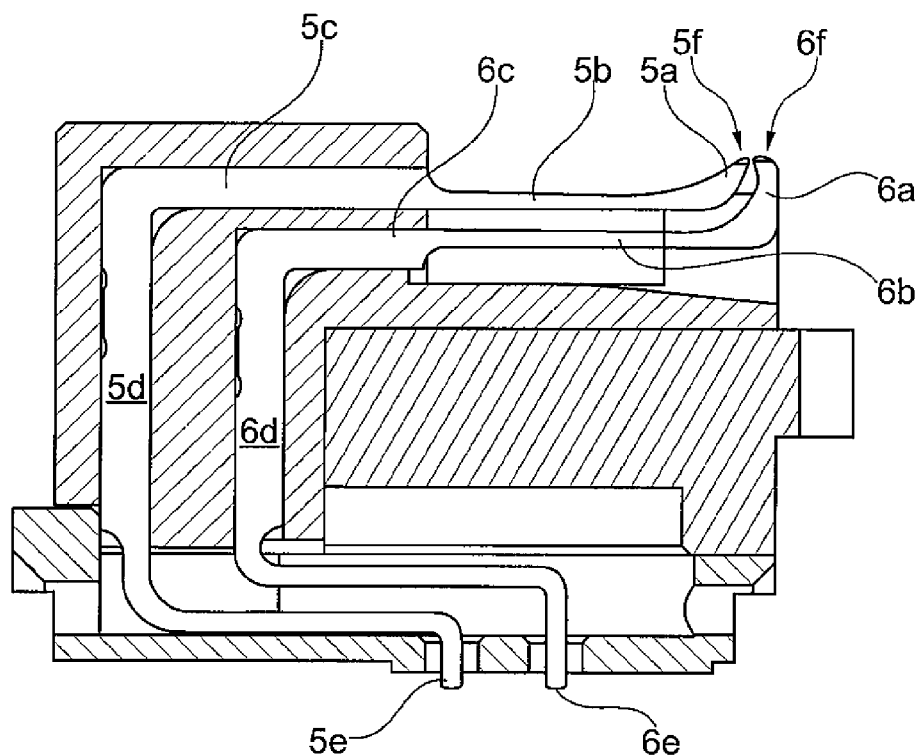
FIG. 2 shows a section through the testing base.

The cross-section through the test base 1, as shown in FIG. 2, is therefore limited to the region that contains the pairs of contact springs 5, 6. The contact springs 5 and 6 basically have a testing arm 5a, 6a and a spring arm 5b, 6b respectively. The dimensions of the contact springs 5, 6, and the connection between the testing arm 5a, 6a and spring arm 5b, 6b, are configured such that the contact spring 5 can be attached above the contact spring 6, but nevertheless the testing tips 5f, 6f are located at the same height, and can make contact with the same contact surface of the electronic component.

As already explained above the differentiation between the testing arm 5a respectively 6a and the spring arm 5b respectively 6b is only possible in functional terms. The task of the spring arm 5b respectively 6b is that of pressing the testing tip 5f respectively 6f with a constant force onto the contact surface of the electronic component, and, after the contact surface has been removed, of moving the testing tip back into its original position. The spring arm 5b respectively 6b is accordingly subjected to an elastic deformation.

The testing arm 5a respectively 6a should not be elastically deformed. It comprises the testing tip 5f respectively 6f and is designed so as to position the latter accurately on the contact surface of the electronic component.

On the side facing opposite the testing arm 5a respectively 6a the spring arm 5b respectively 6b merges into the mounting region 5c respectively 6c. The mounting region 5c respectively 6c is here clamped between parts made from plastic that are not individually designated. Since the heat dissipation into the plastic turns out to be less than the heat dissipation into the ambient air, the surface area of the contact springs in this mounting region is increased. In order that the distance of the two contact springs 5 and 6 from one another can nevertheless be kept small, any widening of the springs in the mounting region 5c, 6c always extends in the direction away from the respectively other contact spring.

A connecting part 5d respectively 6d connects at right angles to the mounting 5c respectively 6c, which connecting part has the task of providing an electrically conducting connection to the contacts 5e respectively 6e on the lower face of the test base 1. These contacts 5e, 6e are connected with correspondingly shaped contact pieces in the testing head that is not shown here. Via the contact springs 5, 6 a low loss electrically conducting connection is implemented between the contact surfaces of the electronic component and the testing head.

Figure 3:
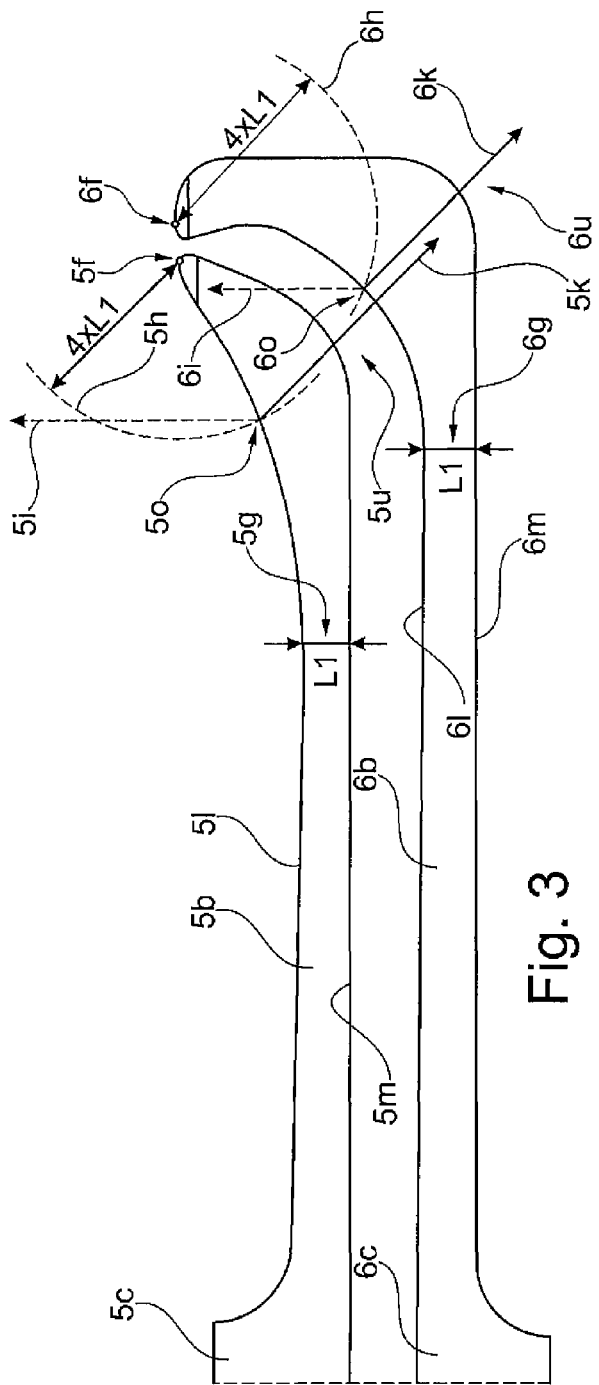
FIG. 3 shows the side view of a pair of contact springs in accordance with an embodiment of the invention, which comprise an upper first contact spring and a lower second contact spring, from the testing tip through to the mounting region.
Figure 4:
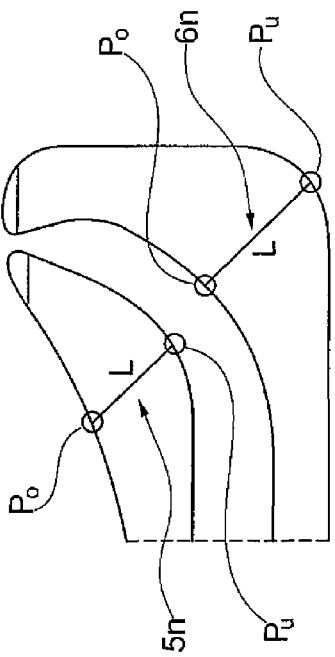
FIG. 4 shows a side view of the testing arm in FIG. 3 without ancillary lines.

The exact configuration of the contact springs 5, 6 with the spring arms 5b, 6b and the testing arms 5a, 6a can be found in FIGS. 3 and 4.

It has proved to be the case that the service life of the contact springs 5, 6 can be increased if their cross-sections and their surface areas are increased. Since the material thickness of the springs is not a variable, on account of the close side-by-side location of the contact surfaces of the electronic components, the contact springs must be matched to these requirements via the configuration of the geometry of their opposing lateral faces.

The testing arm region 5a, 6a is found to be crucial for the service life of the contact springs. Since this is where the increased thermal loading occurs, it is in this region that an enhanced thermal capacity should be created. However, this is not possible in terms of an increase of the size of the testing tip itself, since the space available here is very limited. Any enhancement of the thermal capacity must accordingly be created in a region of the contact springs that is located as close as possible to the testing tip, but which neither increases the build space of the testing tips, nor inhibits the movement of the contact springs. Also the enhancement of the thermal capacity should not result in any reciprocal influencing of the electrical properties of the contact springs bordering close to one another.

It has become apparent that an increase of the thermal capacity is best brought about in the connecting region between testing arm 5a, 6a and spring arm 5b, 6b. Here, the opposing lateral faces of the contact springs can be increased, while the material thickness remains constant, such that sufficient heat can be dissipated from the testing tip such that the temperature of the contact springs remains within in acceptable range. Here, the connecting region between testing arm and spring arm is thickened such that on the one hand a corresponding thermal capacity is achieved, but that on the other hand the two contact springs 5 and 6 do not mutually impair their movement.

Since the force with which the contact springs are pressed onto the contact surface of the electronic component is to be located within a certain range, the minimum thickness 5g, 6g of the spring arm 5b, 6b is determined by the material thickness of the contact springs. However, since the material thickness of the contact springs also has an influence on their thermal capacity, the dimension of the minimum thickness of the spring arm is used for purposes of configuring the connecting region between testing arm and spring arm.

Here, the length for the minimum thickness $5g$ or $6g$ of the spring arm $5b$ or $6b$ is designated as L1. Starting from this length a point Po is defined on the upper boundary line 51 or 61 of the lateral faces of the contact springs, which point Po comprises a distance from the respective testing tip $5f$ or $6f$ of the order of four times the length L1 of the respective contact spring. Thus, the point Po of the contact spring 5 is defined as the point of intersection $5o$ of the upper boundary line 51 of the lateral face of the contact spring 5 with a circular arc $5h$ about the testing tip $5f$, which comprises a radius of 4 times L1 of the contact spring 5, while the point Po of the contact spring 6 is determined as the point of intersection $6o$ of the upper boundary line 61 of the lateral face of the contact spring 6 with a circular arc $6h$ around the testing tip $6f$, wherein the circular arc $6h$ comprises a radius of 4 times L1 of the contact spring 6. For purposes of a better representation of the centre point of the respective circular arc $5h$ or $6h$ the testing tip $5f$ or $6f$ in FIG. 3 in each case is indicated as a small circle.

The thus determined points of intersection $5o$ and $6o$ are apex points of an angle, the first leg $5i$ respectively $6i$ of which extends in the direction of the relative movement between the electronic component and the testing base 1. The second leg $5k$ respectively $6k$ in each case forms an angle of 135° with the first leg $5i$, $6i$.

The points Pu of the two contact springs are defined in terms of the points of intersection $5u$ and $6u$ of the second legs $5k$ and $6k$ with the respective lower boundary lines $5m$ and $6m$ of the lateral faces of the contact springs 5 and 6.

In FIG. 4 the points Po and Pu of the two contact springs 5 and 6, which are ringed with small circles so that they can be more easily discerned, are represented once again without the construction lines in the interests of clarity. Between the points Po and Pu distances $5n$, $6n$ ensue with the dimension L, which in addition to the material thickness is specific to the thermal stability and current carrying capacity of the respective contact spring. The distance of dimension L is a reference parameter for the bulge in a region of the lateral face, which region is not too far away from the testing tip, but nevertheless allows testing tips to stand very close together and does not hinder the movement of the contact springs.

In accordance with an embodiment of the invention the dimension L of the distances $5n$, $6n$ should be at least 2.3 times the length L1 of the minimum thickness of the spring arm. In the example of embodiment shown here with two contact springs 5 and 6 the dimension L of the distance $5n$ for the upper first contact spring 5 is at least 2.35 times, and the dimension L of the distance $6n$ for the lower second contact spring 6 is at least 2.75 times, the length L1 of the respective minimum thickness $5g$ or $6g$.

The minimum thickness $5g$, $6g$ is here always taken to be in the direction of the relative movement between the electronic component, not shown here, and the test base, as is also demonstrated by the first leg $5i$ and $6i$ in FIG. 3.

In the example of embodiment shown the spring arm of the upper contact spring 5 has a minimum thickness $5g$ of L1=0.30 mm (not drawn to scale). The dimension L of the distance between the points Po and Pu is 0.72 mm, that is to say, 2.40 times the length L1. The lower contact spring 6 possesses a minimum thickness $6g$ of L1=0.33 mm and the dimension L of the distance between the points Po and Pu is 0.92 mm, that is to say, 2.79 times the length L1.

LIST OF REFERENCE SIGNS

1 Testing base
2 Anchorage
3 First outer contact spring
4 Second outer contact spring
5 Upper contact spring
6 Lower contact spring
a Testing arm
b Spring arm
c Mounting region
d Connecting part
e Contact
f Testing tip
g Minimum thickness of the spring arm
h Circular arc around the testing tip
i First leg of a 135° angle
k Second leg of a 135° angle
l Upper boundary line of the lateral face
m Lower boundary line of the lateral face
n Distance between Po and Pu
o Point Po
ü Point Pu

What is claimed is:

1. A testing base for current testing, in particular high current testing, of an electronic component, having a multiplicity of contact springs wherein each contact spring is produced from a spring metal sheet of a predetermined thickness and possesses two identical, spaced apart, opposing lateral faces extending in spaced apart planes, and which has one spring arm and one testing arm with a testing tip, wherein the testing arm forms an angle with the spring arm, which enables the testing tip to be positioned on a contact surface of the electronic component running approximately parallel to the spring arm, by means of a relative movement between the testing base and the electronic component, a geometry of the lateral faces fulfills the following conditions:
 a dimension L of a distance between a point Po and a point Pu is at least 2.3 times a length L1; the point Po is located on a boundary line of the lateral face facing towards the electronic component, and comprises a distance from the testing tip of 3 to 5 times the length L1; the point Po forms an apex of an angle in a range between 120° and 150°, one leg of the angle extends in a direction of a relative movement between the testing base and the electronic component towards the electronic component, and another leg of the angle cuts a boundary line of the lateral face facing away from the electronic component at the point Pu; and the length L1 corresponds to a minimum thickness of the spring arm, as viewed in the direction of the relative movement between the testing base and the electronic component, wherein a first contact spring of the contact springs and a second contact spring of the contact springs are provided for contact surfaces of the electronic component, which first and second contact springs are arranged such that their lateral faces are located within a plane wherein the dimension L of the first contact spring differs from the dimension L of the second contact spring.

2. The testing base in accordance with claim 1, wherein the dimension for the distance between the points Po and Pu for the first contact spring is at least 2.35 times the length L1, and for the second contact spring is at least 2.75 times the length L1.

3. The testing base for current testing in accordance with claim 1, wherein the point Po comprises the distance from the testing tip of 4 times the length L1.

4. The testing base for current testing in accordance with claim 1, wherein the point Po forms the apex angle of a 135° angle.

* * * * *